United States Patent [19]
Cecere

[11] Patent Number: 5,747,818
[45] Date of Patent: May 5, 1998

[54] THERMOELECTRIC COOLING IN GAS-ASSISTED FIB SYSTEM

[75] Inventor: Michael A. Cecere, San Jose, Calif.

[73] Assignee: Schlumberger Technologies Inc., San Jose, Calif.

[21] Appl. No.: 734,746

[22] Filed: Oct. 21, 1996

[51] Int. Cl.$^6$ ................................................. H01J 37/317
[52] U.S. Cl. .............. 250/492.21; 250/251; 118/723 FI; 118/726
[58] Field of Search ........................... 250/492.21, 251; 118/723 FI, 726

[56] References Cited

U.S. PATENT DOCUMENTS

| | | | |
|---|---|---|---|
| 4,930,439 | 6/1990 | Sato et al. | 118/723 FI |
| 5,086,230 | 2/1992 | Adachi et al. | 250/492.21 |
| 5,104,684 | 4/1992 | Tao et al. | 427/38 |
| 5,140,164 | 8/1992 | Talbot et al. | 250/492.21 |
| 5,591,970 | 1/1997 | Komano et al. | 250/492.21 |

Primary Examiner—Jack I. Berman
Attorney, Agent, or Firm—Bruce D. Riter

[57] ABSTRACT

Apparatus for supplying a jet of chemical vapor at a substantially constant rate comprises a crucible for containing a quantity of chemical, a hollow needle, a flow path from the crucible to the hollow needle, a Peltier element in thermal communication with the crucible, and a temperature control circuit responsive to temperature in the crucible for powering the Peltier element so as to maintain temperature of the crucible substantially constant. The temperature control circuit powers the Peltier element so as to maintain temperature of the crucible below (or above) ambient temperature. The apparatus is useful in a system for modifying an integrated circuit specimen which further comprises a vacuum chamber and an ion-optical column for directing a focused ion beam at an integrated circuit specimen within the vacuum chamber. Control of vapor pressure, and thus flow rate, offers improved control over FIB processing of integrated circuit specimens.

20 Claims, 5 Drawing Sheets

5,747,818

THERMOELECTRIC COOLING IN GAS-ASSISTED FIB SYSTEM

BACKGROUND OF THE INVENTION

1. Field of the Invention

The present invention relates to methods and apparatus for conducting focused-ion-beam (FIB) operations on integrated circuits.

2. The Prior Art

Conducting operations on an IC device for failure analysis, debug, and even repair, has become commonplace. Typically, a FIB is used to mill away material to expose a conductor and/or to cut a conductor, while introducing a gas or gases to selectively enhance the milling rate of the material to be removed. See, for example, pending U.S. patent application 08/268,790, filed Jun. 30, 1994 of Talbot et al. A FIB can also be used to selectively deposit conductive and insulative material by introducing a suitable gas or gases near the working region of the FIB. See, for example, U.S. Pat. No. 5,104,684 to Tao et al. and pending U.S. patent application 08/434,548 to Ximen et al. Systems for performing FIB operations are known in the art, such as the IDS P2X FIBstation, available commercially from Schlumberger Technologies, Inc., of San Jose, Calif. See also U.S. Pat. No. 5,140,164 to Talbot et al.

FIG. 1 shows a schematic diagram of a typical prior-art system 110 for conducting such operations. System 110 has three main functional elements: a FIB probe 112, a circuit exerciser 114, and a data processing system 116 which includes a display terminal 118. An IC 126 is placed in a vacuum chamber 128 of FIB probe 112. Circuit exerciser 114 may be a conventional IC tester which can repeatedly apply a pattern of test vectors to IC 126 over a bus in response to commands received from data processing system 116 over bus 110. The FIB can be aimed at a desired location on the IC in response to commands supplied from data processing system 116 over bus 122. A charged particle detector within FIB probe 112 supplies measurements of the energy of secondary charged particles to data processing system 116 over bus 122. Data processing system 116 may be commanded by an operator to specify the test signal pattern used and the timing of measurements relative to the test signal pattern.

FIG. 2 shows a more detailed schematic diagram of such a FIB system 200. A vacuum chamber 202 evacuated by pumps 204 encloses a FIB column 206, a specimen stage 208 for holding a specimen 210 such as an IC device to be repaired, a detector 212, and a gas injector 214. Column 206 includes an ion source 216, and ion-optical elements 218 for controlling alignment and deflection of an ion beam 220. Detector 212 may comprise a scintillator 222 and a photomultiplier tube 224 for detecting secondary electrons 226 emitted when ion beam 220 impinges on specimen 210.

The system includes a workstation 230 having a processor unit (CPU) 234, a monitor 236 and input/output (I/O) devices 238 such as a keyboard and/or mouse. Workstation 230 is linked by a bus 240 to a system control unit 242 comprising a control CPU, an image processor and image memory. System control unit 242 communicates via a bus 244 with a vacuum-pumps control 246 for controlling vacuum pumps 204, with gas injector control 248 for controlling gas injector 214, with FIB high-voltage control 250 for controlling ion source 216, with FIB alignment & deflection control 252 for controlling ion optical elements 218, with imaging electronics 254 which receive a detector signal from detector 212, and with specimen-stage control 256 for controlling specimen stage 208 to position specimen 210. System control unit 242 preferably receives image information from imaging electronics 254 and supplies beam control information to FIB alignment and deflection control 252.

In operation, a specimen 210 is placed in vacuum chamber 202. Chamber 202 is evacuated. Under control of system control unit 242, FIB 220 is scanned over a selected region of the specimen to mill away material from the surface of specimen 210 and/or to deposit material on the surface of specimen 210. During milling and deposition, a suitable gas is injected at the surface of specimen 210 from gas injector 214. In the Schlumberger IDS P2X FIBstation, for example, separate crucibles are provided for storage of multiple gas-producing compounds. The crucibles supply gas to an injector needle via a controllable manifold (not illustrated) so that rapid switch-over from one gas to another is possible upon command from the system control unit.

FIG. 3 schematically illustrates a portion 300 of prior-art gas injector 214 in partial cross-sectional view. A stainless-steel crucible 305 contains a solid or liquid chemical 310 to be used as a source for injection gas. A temperature controller 315 regulates temperature of crucible 305 by monitoring the output of a temperature sensor 320 and controlling a power supply 325 which powers a resistive heater 330. Temperature controller 315 is set by command from system control unit 242 so that a constant temperature suitable for the injection chemical is maintained in the crucible. Injection-chemical vapor passes from the crucible to a manifold 335 via first and second tube portions 340 and 345 joined at a connection 350, through a valve 355 which is controlled by gas injector control 248, and through third and fourth tube portions 360 and 365 joined at a connection 370. An O-ring seal 372 between crucible 305 and a flange 374 of tube portion 340 prevents unwanted release of vapor. Manifold 335 has additional input lines such as lines 375 and 380 for receiving vapors from other crucibles, and an output line 385 for supplying vapors to an injector needle 390. A resistive heater 392 powered by power supply 325 under control of temperature controller 315 maintains the temperature of vapor as it passes from crucible 305 to manifold 335. Insulation 394 is provided to help maintain an even temperature. The temperature of the chemical is thus maintained by a simple closed-loop control system in a range of about 10°–60° Celcius.

When a compound to be used for gas injection has a vapor pressure that is too high for the range of temperatures achievable by resistive heating of the crucible, a restrictive aperture 396 is optionally provided in tube portion 340 to reduce the gas flow rate and allow the crucible temperature to be raised into the achievable range. Aperture 396 is typically mounted immediately above crucible 305, upstream of valve 355, in order to limit the volume of vapor contained behind the aperture and thus reduce the crucible pump-down time.

The use of a flow-restriction aperture with such chemicals has a number of disadvantages. First, the aperture can clog and is not easily removed for cleaning. Second, pressure builds up in the flow passage when vapor flow is shut off. When vapor flow is restarted, pressure behind the aperture is high and the flow rate is higher than intended. The pressure must be bled down either through the aperture or through another flow path (not illustrated) to an acceptable level before gas injection at a stabilized flow rate can occur. If bleed-off is through the injection needle, the injection chemical is at a higher-than-intended partial pressure within the vacuum chamber and must be pumped out. Third, vapor is wasted which reduces the lifetime of a prepared crucible. More frequent crucible replacement increases operating cost and system downtime.

Improved methods and apparatus for controlling flow of injection-chemical vapors are desired.

SUMMARY OF THE INVENTION

Preferred embodiments of the invention provide for thermoelectric cooling or heating of the crucible with a Peltier element. This can eliminate for some injection chemicals the need for a flow-restriction aperture. For other injection chemicals it can avoid some of the disadvantages otherwise encountered with the use of a flow-restriction aperture. Thermoelectric cooling can overcome difficulties associated with an aperture and can make possible the vapor-injection of chemicals which are otherwise impractical for use in FIB operations.

In a preferred form, the invention provides apparatus for supplying a jet of chemical vapor at a substantially constant rate, comprising a crucible for containing a quantity of chemical, a hollow needle, a flow path from the crucible to the hollow needle, a Peltier element in thermal communication with the crucible; and a temperature control circuit responsive to temperature in the crucible for powering the Peltier element so as to maintain temperature of the crucible substantially constant. The temperature control circuit powers the Peltier element so as to maintain temperature of the crucible below (or above) ambient temperature. The temperature control circuit may comprise a temperature sensor responsive to temperature in the crucible, a temperature controller responsive to the temperature sensor, and a power supply responsive to the temperature controller for powering the Peltier element. A heat sink in thermal communication with the Peltier element improves heat transfer. A fan for moving ambient air over the heat sink may also be used to enhance heat transfer. A controllable valve is provided in the flow path for starting and stopping flow of vapor to the hollow needle. A heating element may be provided in thermal communication with the flow path, along with a second temperature control circuit for powering the heating element so as to maintain temperature of the flow path substantially constant. The flow path preferably includes a thermally-insulative portion which provides a thermal break between the crucible and other portions of the flow path.

The chemical-vapor supplying apparatus can be used as a subsystem of an apparatus for modifying an integrated circuit specimen which further comprises a vacuum chamber and an ion-optical column for directing a focused ion beam at an integrated circuit specimen within the vacuum chamber. Control of vapor pressure, and thus flow rate, offers improved control over FIB processing of integrated circuit specimens.

Preferred methods in accordance with the invention comprise supplying a jet of chemical vapor at a substantially constant rate by storing a quantity of chemical in a crucible in thermal communication with a Peltier element, placing the crucible in communication with a hollow needle along a flow path from the crucible to the hollow needle, monitoring temperature in the crucible with a temperature sensor, and powering the Peltier element so as to maintain temperature of the crucible substantially constant. Ambient air may be passed over a heat sink in thermal communication with the Peltier element. The Peltier element is powered by supplying a current to the Peltier element so as to cool the crucible below ambient temperature or to warm the crucible above ambient temperature.

These and other features of the invention will become apparent to those of skill in the art from the following description and the accompanying drawing figures.

DETAILED DESCRIPTION

Figure 1:
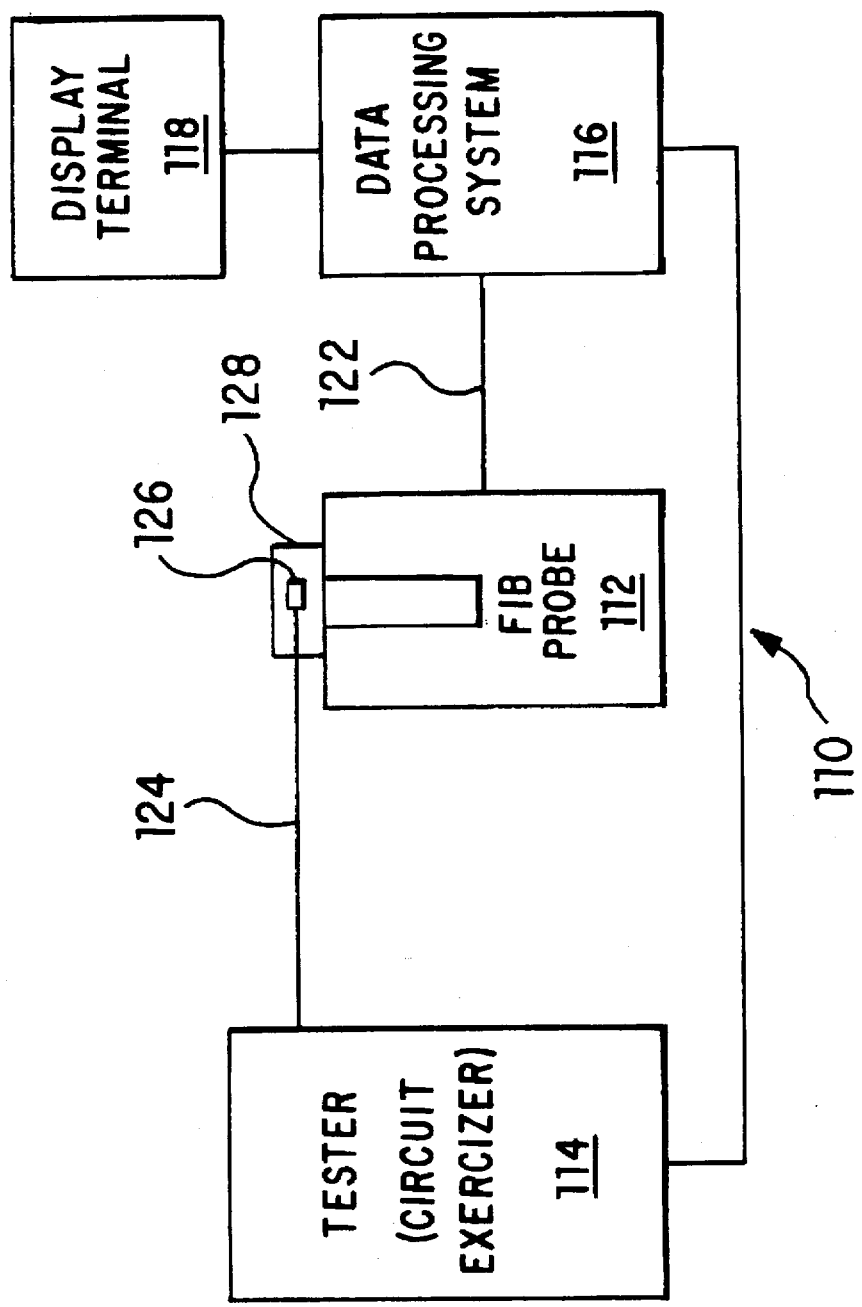
FIG. 1 shows a schematic diagram of a typical prior-art FIB system.
Figure 2:
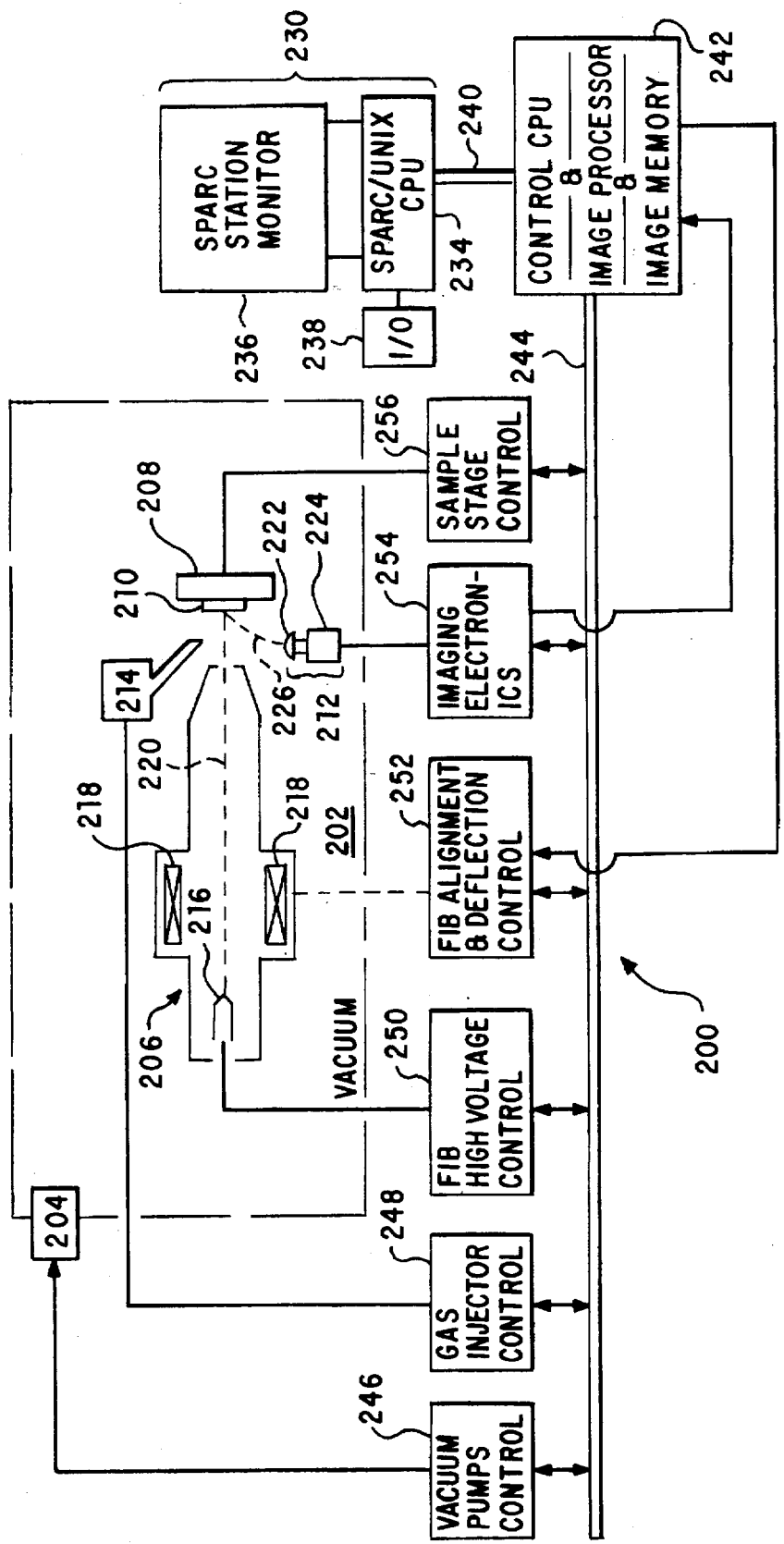
FIG. 2 shows a more detailed schematic diagram of a prior-art FIB system.
Figure 3:
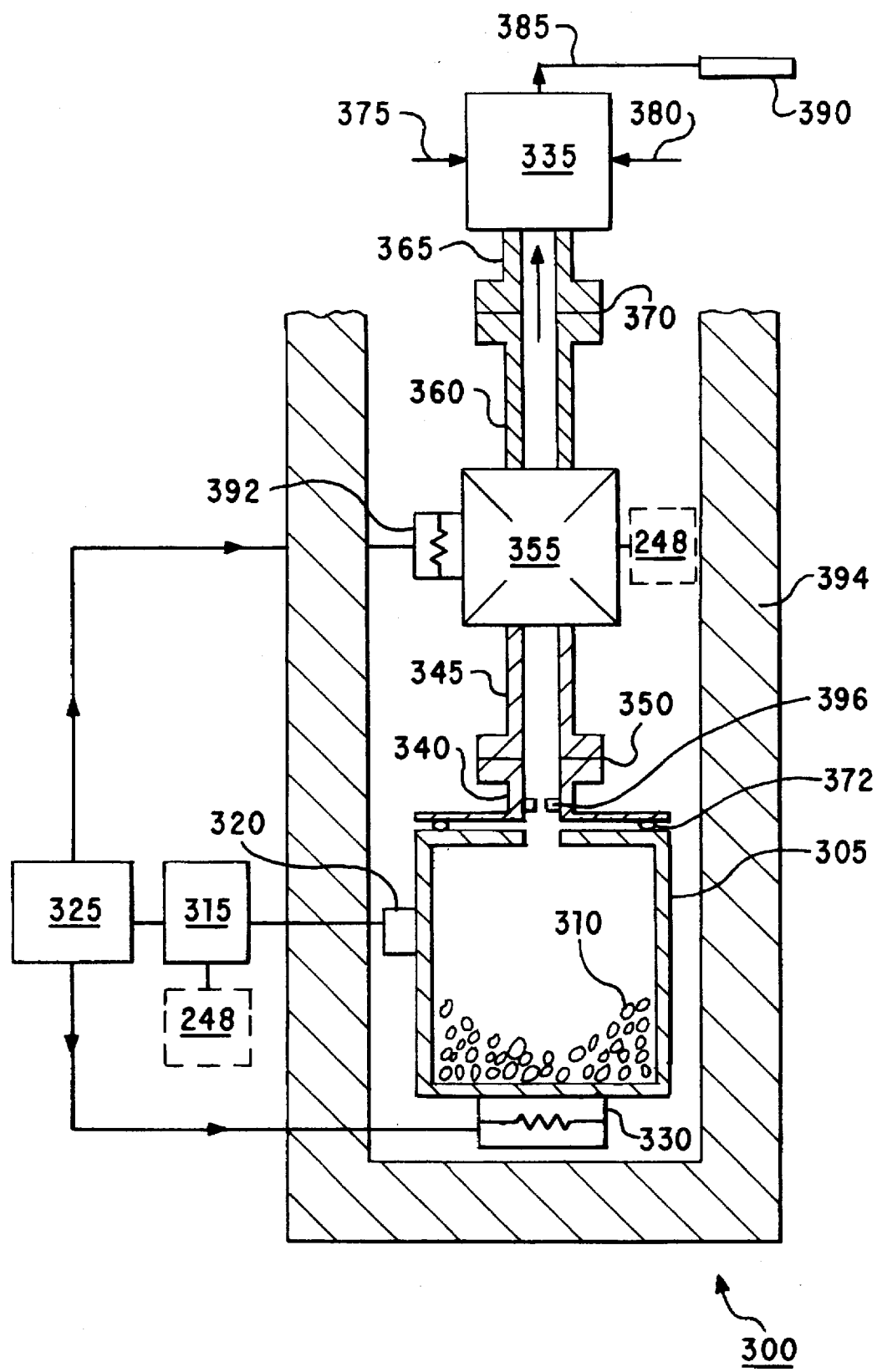
FIG. 3 schematically illustrates a portion of a prior-art gas injector in partial sectional view.
Figure 4:
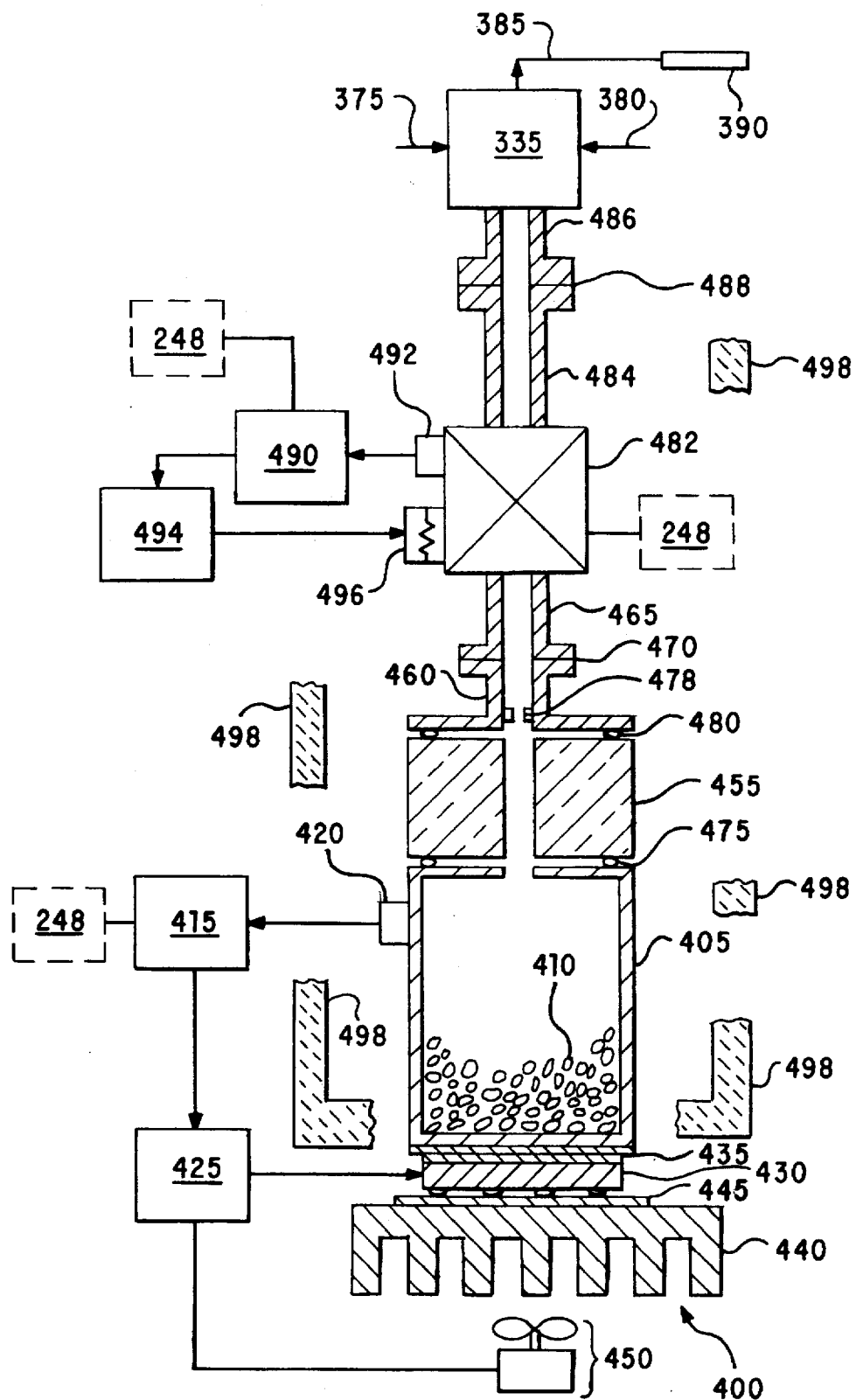
FIG. 4 schematically illustrates a gas injector subsystem embodiment in accordance with the invention in partial sectional view.

FIG. 4 schematically illustrates a gas injector subsystem embodiment 400 in accordance with the invention in partial sectional view. A stainless-steel crucible 405 contains a chemical 410 to be used as a source for injection gas. A temperature controller 415 regulates temperature of crucible 405 by monitoring the output of a temperature sensor 420 and controlling a power supply 425 which powers a Peltier element (thermoelectric device) 430. Temperature controller is set by command from system control unit 248 so that a constant temperature suitable for the injection chemical is maintained in the crucible. Peltier element 430 is affixed to crucible 405 so as to provide a good heat conduction path between the two, such as with a strip 435 of double-sided thermally-conducting adhesive tape. A heat sink 440 is affixed to the opposite face of Peltier element 430 so as to provide a good heat-conduction path between the two, such as with a strip 445 of double-sided thermally-conducting adhesive tape. It is important to have thermally-conducting interfaces so as to avoid compromising efficiency of the system. A fan 450, which may also be powered by power supply 425 under control of temperature controller 415, is optionally provided to improve convective heat transfer between heat sink 440 and the atmosphere.

Any of a wide variety of commercially available products may be used for the Peltier element 430, for heat sink 440 and for double-sided thermally-conducting adhesive tape strips 435 and 445. For example, Peltier element 430 can be a thermoelectric cooling element part number CP-1.0-127-06L, available from Melcor, Trenton, N.J., which can pump a maximum of 25 watts running at up to 15 volts and 3 amps.

A convenient heat sink 440 for this application is the type intended for cooling of 80486 or Pentium microprocessor chips. These often are provided with double-sided, thermally-conducting adhesive tape which allows easy and efficient mounting to Peltier element 430. The same kind of adhesive tape can also be used to mate Peltier element 430 to the bottom of crucible 405 making assembly easy. Heat sink 440 can be an Aavid Engineering model 3302 heat sink. Alternatively, a heat sink and fan combination can be used, such as Sanyo Denki Co. part number 109P4405H8026. Double-sided thermally-conducting adhesive tape is available from Aavid Engineering under part number D037302385B.

Temperature controller 415 can be an Auto-Tune PID (proportional, integral, derivative) controller part number CN-76000, available from Omega Engineering, Stamford, Conn. The temperature controller reads the temperature from sensor 420 mounted on crucible 405 and outputs a signal voltage which controls a constant-current power supply capable of providing, for example, up to 1 amp at 5 volts DC. With the arrangement described, temperatures down to zero degrees Celcius are readily achieved with a small fan blowing on the heat sink in a room-temperature ambient environment. The parameters given can be altered when used with different models and makes of thermoelectric element 430.

Peltier element 430 can also be used for heating crucible 405 by reversing the flow of current through the Peltier element. The arrangement described has been tested and found to easily lower the crucible temperature to as low as zero degrees Celcius or to raise the crucible temperature to the maximum desirable operating level of 60° Celcius. The operating temperature range can be extended by substituting a stacking of multiple Peltier elements for the single Peltier element 440 shown in FIG. 4.

When temperature of crucible 405 is stabilized at a level appropriate for the chemical to be injected, chemical vapor passes from crucible 405 to a hollow injection needle 390 via a bore in a thermally-insulating spacer 455 of Teflon or other suitable material, through first and second tube portions 460 and 465 joined at a connection 470, through a valve 482 which is controlled by gas injector control 248, through third and fourth tube portions 484 and 486 joined at a connection 488, and via a manifold 335 and supply line 385. O-ring seal 475 between spacer 455 and crucible 405 and O-ring seal 480 between spacer 455 and a flange 478 of tube portion 460 prevent unwanted release of vapor. An optional flow restriction aperture 478 can be provided if the vapor pressure of a particular chemical to be injected is insufficiently reduced by cooling, making possible the use of injection chemicals which were heretofore impractical due to their high vapor pressures at or above ambient temperature.

A resistive heater 496 powered by power supply 494 under control of temperature controller 490 maintains the temperature of vapor as it passes from crucible 405 to the manifold, avoiding condensation of vapor in the flow path. While shown heating valve 482, resistive heating element 496 can be used to heat other portions of the flow path above thermally-insulating spacer 455 as needed to avoid condensation of vapor. Heating element 496 can, for example, be a plurality of separate heating elements for heating respective segments of the flow path, and/or can be a resistive heating tape. Peltier elements supplied with current to heath the flow path can be substituted for resistive heating elements. Insulation 498, only a portion of which is shown for clarity of illustration, is provided wherever possible to help maintain an even temperature along the vapor flow path by thermally decoupling the assembly from the ambient environment.

Crucible 405 is a container preferably made of chemically inert material such as stainless steel, mounted for easy removal from the system. Components defining the vapor flow path, such as tube portions 460, 465, 484 and 486 are also preferably made of chemically inert material such as stainless steel. Spacer 455 is also of chemically inert material, though in this case the material must also be thermally insulative, such as Teflon, so as to thermally isolate crucible 405 from the rest of the vapor flow path.

Figure 5:
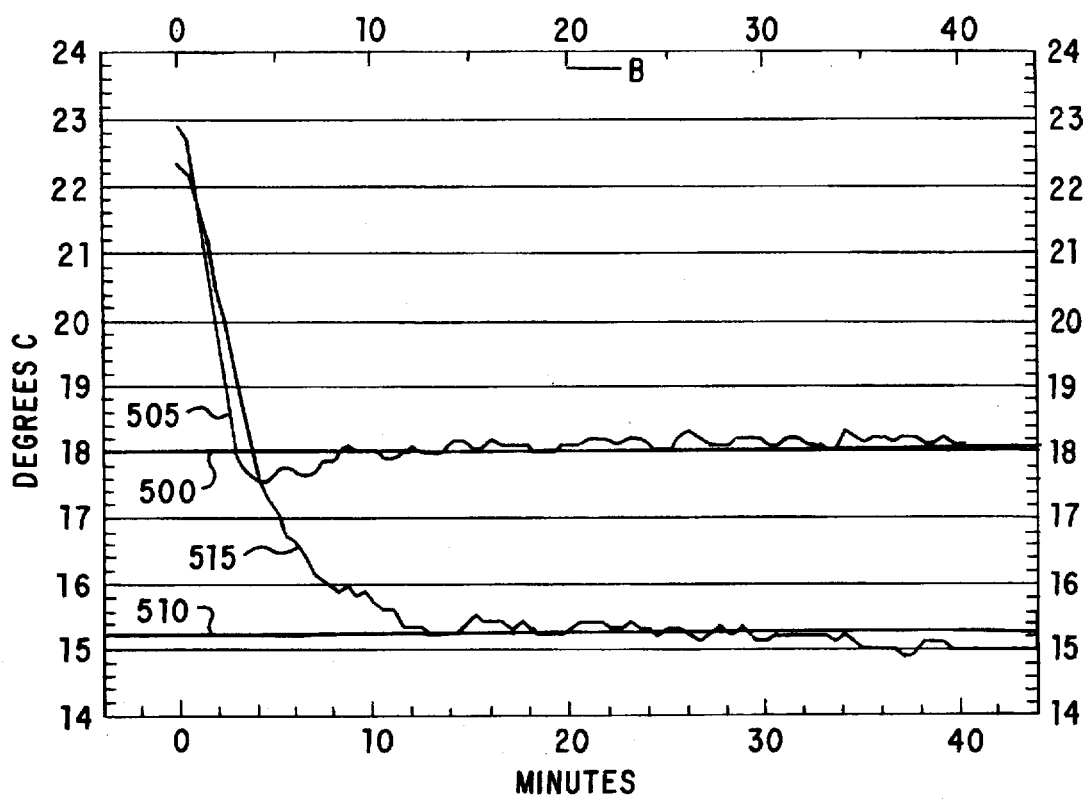
FIG. 5 shows crucible temperature vs. time for two different injection chemicals in accordance with the invention.

FIG. 5 shows crucible temperature vs. time for two different injection chemicals in accordance with the invention. The examples show the crucible temperature stabilizing within about 10–12 minutes after beginning to cool the crucible with the Peltier element. With the temperature controller set at 18° Celcius as indicated by line 500, the temperature drops from ambient 22+° Celcius to just below 18° Celcius in about 4 minutes, and then is maintained within a narrow range about 18° Celcius as indicated by trace 505. With the temperature controller set at 15.2° Celcius as indicated by line 510, the temperature drops from ambient 22+° Celcius to about 15.2° Celcius in about 12 minutes, and then is maintained within a narrow range about 15.2° Celcius as indicated by trace 515. In general, the temperature can be kept stable to within about ±1° Celcius with a temperature control system in accordance with the invention.

Figure 6:
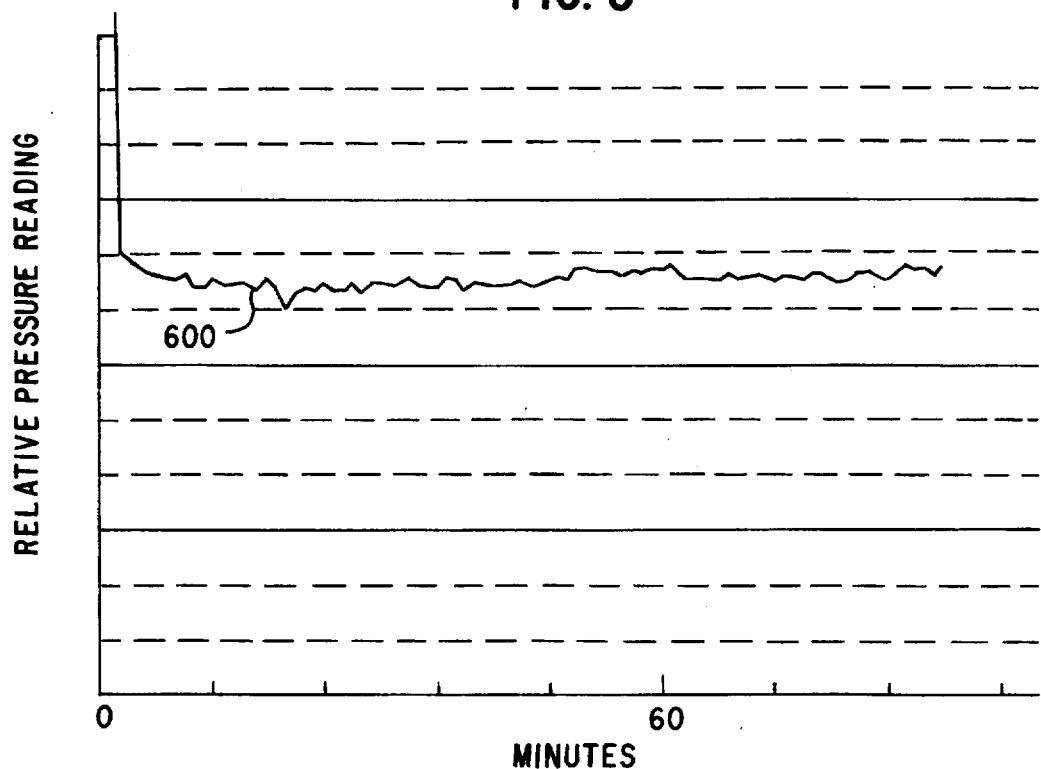
FIG. 6 shows relative pressure vs. time for an injection chemical in a thermoelectrically cooled crucible in accordance with the invention.

FIG. 6 shows relative pressure vs. time for an injection chemical in a thermoelectrically cooled crucible in accordance with the invention. As shown by trace 600, relative pressure within the crucible stabilizes within minutes of beginning to cool the crucible with the Peltier element, and remains stabilized within a narrow range over an extended period of operation. Stabilized vapor pressure at a desired level below that possible at room temperature, or above that possible at room temperature, is achieved with the system described.

A gas-assisted FIB system such as the IDS P2X FIB station, available commercially from Schlumberger Technologies, Inc., of San Jose, Calif., may be readily modified in accordance with the invention.

Thermoelectric cooling of the crucible allows the elimination of an aperture in the gas-injection flow line when using chemicals which have inconveniently high vapor pressures at conventional working temperatures. By lowering the temperature of the compound below room temperature (down to as low as 0° Celcius), vapor pressure of the material is lowered so as to decrease the effective partial pressure of the material in the vacuum chamber where the sample is located. Thermoelectric cooling allows control of the vapor pressure of the material as opposed to controlling the flow rate with an aperture. This results in a more direct control over the flow rate and over the vacuum chamber total pressure. In operation of a FIB system, the vacuum chamber total pressure is most easily monitored—the chamber pressure is noted before commencing injection-gas flow and again after injection-gas flow has stabilized.

Eliminating a flow-restriction aperture avoids the possibility of the aperture becoming corroded and/or blocked by the sometimes corrosive gases passing through. Any foreign particle larger than the few tens of microns diameter of the aperture can completely block the flow of gas to the injection needle. Avoiding use of a flow-restriction aperture can thus reduce system downtime and related costs. Controlling the system pressure with thermoelectric cooling also allows for more efficient use of the chemical since only as much as is needed is released from the crucible.

When there is an aperture in the system pressure builds up greatly behind the valve when that gas is not being used and needs to be vented off before that gas can be used again. Since this built up pressure needs to be released through the aperture this results in extra time required before being able to use that gas and might also result in the need for an auxiliary pump-around valve to permit pumping out this built up gas quickly by going around the aperture through another pipe and valve. This built up gas also represents a waste of chemical which would therefore require more frequent refilling of the crucible as the material is used up more quickly.

For compounds that do require heating even without an aperture a thermoelectric cell can also be used for heating the crucible by simply reversing the direction of electrical current flow through the device relative to that used in the cooling mode. This benefit would work as well as resistive heating with the added benefit of having a multitude of crucibles of all the same construction so that different chemicals with radically different vapor pressures would all still be able to use the same type crucible design.

Those of skill in the art will recognize that these and other modifications can be made within the spirit and scope of the invention as defined in the claims which follow.

What is claimed is:

1. Apparatus for supplying a jet of chemical vapor at a substantially constant rate, comprising:
   a. a crucible (405) for containing a quantity of chemical (410);
   b. a hollow needle (390);
   c. a flow path (455, 460, 470, 482, 484, 486) from the crucible to the hollow needle;
   d. a Peltier element (430) in thermal communication with the crucible; and
   e. a temperature control circuit (415, 420, 425) responsive to temperature in the crucible for powering the Peltier element so as to maintain temperature of the crucible substantially constant.

2. The apparatus of claim 1, wherein the temperature control circuit powers the Peltier element so as to maintain temperature of the crucible below ambient temperature.

3. The apparatus of claim 2, wherein the temperature control circuit comprises a temperature sensor (420) responsive to temperature in the crucible, a temperature controller (415) responsive to the temperature sensor, and a power supply (425) responsive to the temperature controller for powering the Peltier element.

4. The apparatus of claim 1, further comprising a heat sink (440) in thermal communication with the Peltier element.

5. The apparatus of claim 4, further comprising a fan (450) for moving ambient air over the heat sink.

6. The apparatus of claim 1, further comprising a controllable valve 482 for starting and stopping flow of vapor to the hollow needle.

7. The apparatus of claim 1, further comprising a heating element (496) in thermal communication with the flow path, and a second temperature control circuit (490, 492, 494) for powering the heating element so as to maintain temperature of the flow path substantially constant.

8. The apparatus of claim 1, wherein the flow path includes a thermally-insulative portion (455) which provides a thermal break between the crucible and other portions of the flow path.

9. A method of supplying a jet of chemical vapor at a substantially constant rate, comprising:
   a. storing a quantity of chemical (410) in a crucible (405) in thermal communication with a Peltier element (430);
   b. placing the crucible in communication with a hollow needle (390) along a flow path (455, 460, 470, 482, 484, 486) from the crucible to the hollow needle;
   c. monitoring temperature in the crucible with a temperature sensor (420); and
   d. powering the Peltier element so as to maintain temperature of the crucible substantially constant.

10. The method of claim 9, further comprising the step of passing ambient air over a heat sink in thermal communication with the Peltier element.

11. The method of claim 9, wherein powering the Peltier element comprises supplying a current to the Peltier element so as to cool the crucible below ambient temperature.

12. The method of claim 9, wherein powering the Peltier element comprises supplying a current to the Peltier element so as to warm the crucible above ambient temperature.

13. Apparatus for modifying an integrated circuit specimen, comprising:
   a. a vacuum chamber (202);
   b. an ion-optical column (206) for directing a focused ion beam at an integrated circuit specimen (210) within the vacuum chamber; and
   c. a gas injector subsystem (214) including
      i. a crucible (405) for containing a quantity of chemical (410);
      ii. a hollow needle (390);
      iii. a flow path (455, 460, 470, 482, 484, 486) from the crucible to the hollow needle;
      iv. a Peltier element (430) in thermal communication with the crucible; and
      v. a temperature control circuit (415, 420, 425) responsive to temperature in the crucible for powering the Peltier element so as to maintain temperature of the crucible substantially constant.

14. The apparatus of claim 13, wherein the temperature control circuit powers the Peltier element so as to maintain temperature of the crucible below ambient temperature.

15. The apparatus of claim 14, wherein the temperature control circuit comprises a temperature sensor (420) responsive to temperature in the crucible, a temperature controller (415) responsive to the temperature sensor, and a power supply (425) responsive to the temperature controller for powering the Peltier element.

16. The apparatus of claim 13, further comprising a heat sink (440) in thermal communication with the Peltier element.

17. The apparatus of claim 16, further comprising a fan (450) for moving ambient air over the heat sink.

18. The apparatus of claim 13, further comprising a controllable valve (482) for starting and stopping flow of vapor to the hollow needle.

19. The apparatus of claim 13, further comprising a heating element (496) in thermal communication with the flow path, and a second temperature control circuit (490, 492, 494) for powering the heating element so as to maintain temperature of the flow path substantially constant.

20. The apparatus of claim 14, wherein the flow path includes a thermally-insulative portion (455) which provides a thermal break between the crucible and other portions of the flow path.

* * * * *